(12) United States Patent
Matsumoto

(10) Patent No.: US 11,510,352 B2
(45) Date of Patent: Nov. 22, 2022

(54) COMPONENT SUPPLY DEVICE

(71) Applicant: FUJI CORPORATION, Chiryu (JP)

(72) Inventor: Toru Matsumoto, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 343 days.

(21) Appl. No.: 16/772,437

(22) PCT Filed: Dec. 27, 2017

(86) PCT No.: PCT/JP2017/046862
§ 371 (c)(1),
(2) Date: Jun. 12, 2020

(87) PCT Pub. No.: WO2019/130463
PCT Pub. Date: Jul. 4, 2019

(65) Prior Publication Data
US 2021/0022278 A1      Jan. 21, 2021

(51) Int. Cl.
*H05K 13/08*     (2006.01)
*B25J 13/08*     (2006.01)
(Continued)

(52) U.S. Cl.
CPC .............. *H05K 13/08* (2013.01); *B25J 13/08* (2013.01); *H05K 13/02* (2013.01); *H05K 13/043* (2013.01);
(Continued)

(58) Field of Classification Search
CPC .... H05K 13/02; H05K 13/021; H05K 13/022; H05K 13/028; H05K 13/043;
(Continued)

(56) References Cited

U.S. PATENT DOCUMENTS

| 6,056,108 A * | 5/2000 | Buchi .................... B25J 9/1697 |
| | | 198/395 |
| 10,206,318 B2 * | 2/2019 | Matsumoto ........ H05K 13/0452 |
| 10,264,719 B2 * | 4/2019 | Iwaki .................... H05K 13/028 |
| 10,485,151 B2 * | 11/2019 | Ishikawa ............ H05K 13/0813 |

(Continued)

FOREIGN PATENT DOCUMENTS

| CN | 107073718 A | 8/2017 |
| EP | 3 216 571 A1 | 9/2017 |

(Continued)

OTHER PUBLICATIONS

International Search Report dated Apr. 10, 2018 in PCT/JP2017/046862 filed Dec. 27, 2017, citing documents AA-AC and AO-AS therein, 2 pages.

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

A component supply device, including a stage on which components are scattered; an imaging device configured to image components scattered on the stage; a storage device configured to store first identification information capable of identifying a first component which is a component scheduled to be supplied from the stage and second identification information capable of identifying a second component which is a component not scheduled to be supplied from the stage; and a determination device configured to determine whether the first component is present on the stage based on the first identification information and imaging data from the imaging device, and to determine whether the second component is present on the stage based on the second identification information and imaging data from the imaging device.

6 Claims, 12 Drawing Sheets

(51) Int. Cl.
 *H05K 13/02* (2006.01)
 *H05K 13/04* (2006.01)
(52) U.S. Cl.
 CPC ......... *H05K 13/081* (2018.08); *H05K 13/086* (2018.08); *Y10T 29/53174* (2015.01)
(58) Field of Classification Search
 CPC ............. H05K 13/0434; H05K 13/081; H05K 13/0812; H05K 13/0813; H05K 13/086; Y10T 29/4913; Y10T 29/49131; Y10T 29/49133; Y10T 29/49137; Y10T 29/53174; Y10T 29/53178; Y10T 29/53183; B65G 47/12; B65G 47/14; B65G 47/1478; B65G 47/1485; B65G 47/1492; B65G 47/16; B65G 47/905; B65G 47/912; B65G 47/917
 See application file for complete search history.

(56) References Cited

U.S. PATENT DOCUMENTS

| | | |
|---|---|---|
| 2014/0290055 A1 | 10/2014 | Kurata |
| 2016/0330880 A1* | 11/2016 | Morikawa ............ B65G 47/145 |
| 2017/0196131 A1 | 7/2017 | Ishikawa |
| 2017/0238448 A1 | 8/2017 | Iwaki |

FOREIGN PATENT DOCUMENTS

| | | |
|---|---|---|
| JP | 8-43025 A | 2/1996 |
| JP | 2014-41895 A | 3/2014 |
| JP | 2014-110335 A | 6/2014 |
| JP | 2016-219472 A | 12/2016 |
| JP | 2017-191889 A | 10/2017 |
| WO | WO 2015/186188 A1 | 12/2015 |
| WO | WO 2016/071984 A1 | 5/2016 |
| WO | WO 2017/208325 A1 | 12/2017 |

* cited by examiner

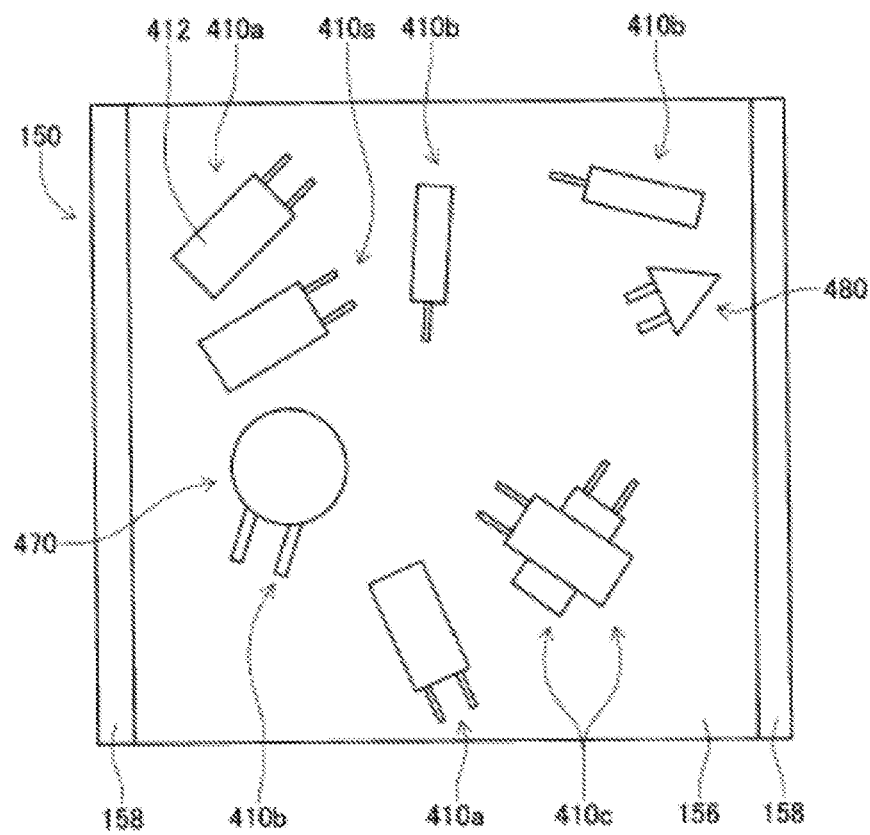
Fig. 14
Fig. 15
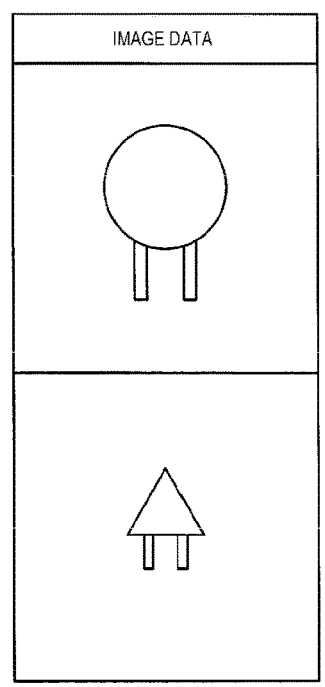

COMPONENT SUPPLY DEVICE

TECHNICAL FIELD

The present application relates to a component supply system comprising a stage on which components are scattered.

BACKGROUND ART

As described in the Patent Literature below, there are component supply devices in which components are scattered on a stage.

PATENT LITERATURE

Patent Literature 1: JP-A-2016-219472
Patent Literature 2: JP-A-2014-110335

BRIEF SUMMARY

Technical Problem

The object of the present disclosure is to properly supply components on a stage of a component supply device.

Solution to Problem

In order to solve the above problem, the present specification discloses a component supply device comprising: a stage on which components are scattered; an imaging device configured to image components scattered on the stage; a storage device configured to store first identification information capable of identifying a first component which is a component scheduled to be supplied from the stage and second identification information capable of identifying a second component which is a component not scheduled to be supplied from the stage; a determination device configured to determine whether the first component is present on the stage based on the first identification information and imaging data from the imaging device, and to determine whether the second component is present on the stage based on the second identification information and imaging data from the imaging device.

Advantageous Effects

In the present disclosure, the first identification information capable of identifying the first component, which is a component that is scheduled to be supplied from the stage, and the second identification information capable of identifying the second component, which is a component that is not scheduled to be supplied from the stage, are stored in the storage device. Then, based on the first identification information and the second identification information, it is determined whether the first component is on the stage and whether the second component is on the stage. This makes it possible to handle the second component on the stage and properly supply the first component.

BRIEF DESCRIPTION OF DRAWINGS

FIG. 14 A diagram showing a state in which lead components are scattered on the stage.
FIG. 15 A diagram showing a second component and a third component recognized by pattern matching.

DESCRIPTION OF EMBODIMENTS

Hereinafter, embodiments of the present disclosure will be described in detail with reference to the drawings.

(A) Configuration of a Component Mounting Machine

Figure 1:
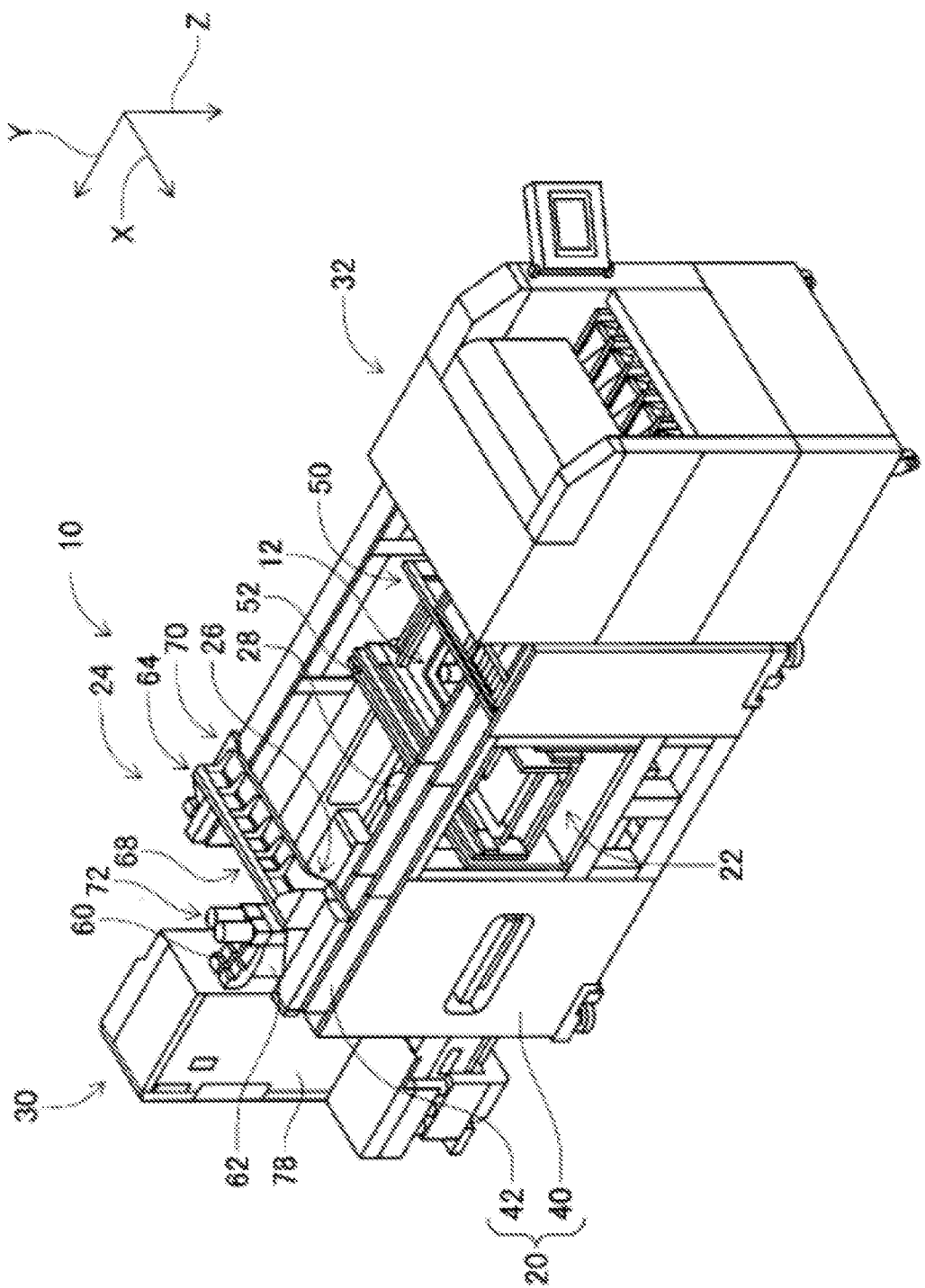
FIG. 1 A perspective view showing a component mounting machine.

FIG. 1 shows component mounting machine 10. Component mounting machine 10 is a device for mounting components on circuit substrate 12. Component mounting machine 10, device main body 20, substrate conveyance and holding device 22, component mounting device 24, imaging device 26, 28, component feeding device 30, bulk component supply device 32, and control device (refer to FIG. 11) 34. Circuit substrate 12 may be a circuit board, or a substrate or the like having a three-dimensional structure, and the circuit board may be a printed wiring board, a printed circuit board, or the like.

Device main body 20 is constituted by frame section 40 and beam section 42 which is installed on frame section 40. Substrate conveyance and holding device 22 is disposed in the center in the front-rear direction of frame section 40, and has conveyance device 50 and clamping device 52. Conveyance device 50 is a device for conveying circuit substrate 12, and clamping device 52 is a device for holding circuit substrate 12. Thus, substrate conveyance and holding device 22 conveys circuit substrate 12 and holds circuit substrate 12 in a fixed manner at a predetermined position. In the following description, the conveyance direction of circuit substrate 12 is referred to as the X-direction, the horizontal direction perpendicular to the X-direction is referred to as the Y-direction, and the vertical direction is referred to as the Z-direction. In other words, the width direction of component mounting machine 10 is the X-direction, and the front-rear direction is the Y-direction.

Figure 2:
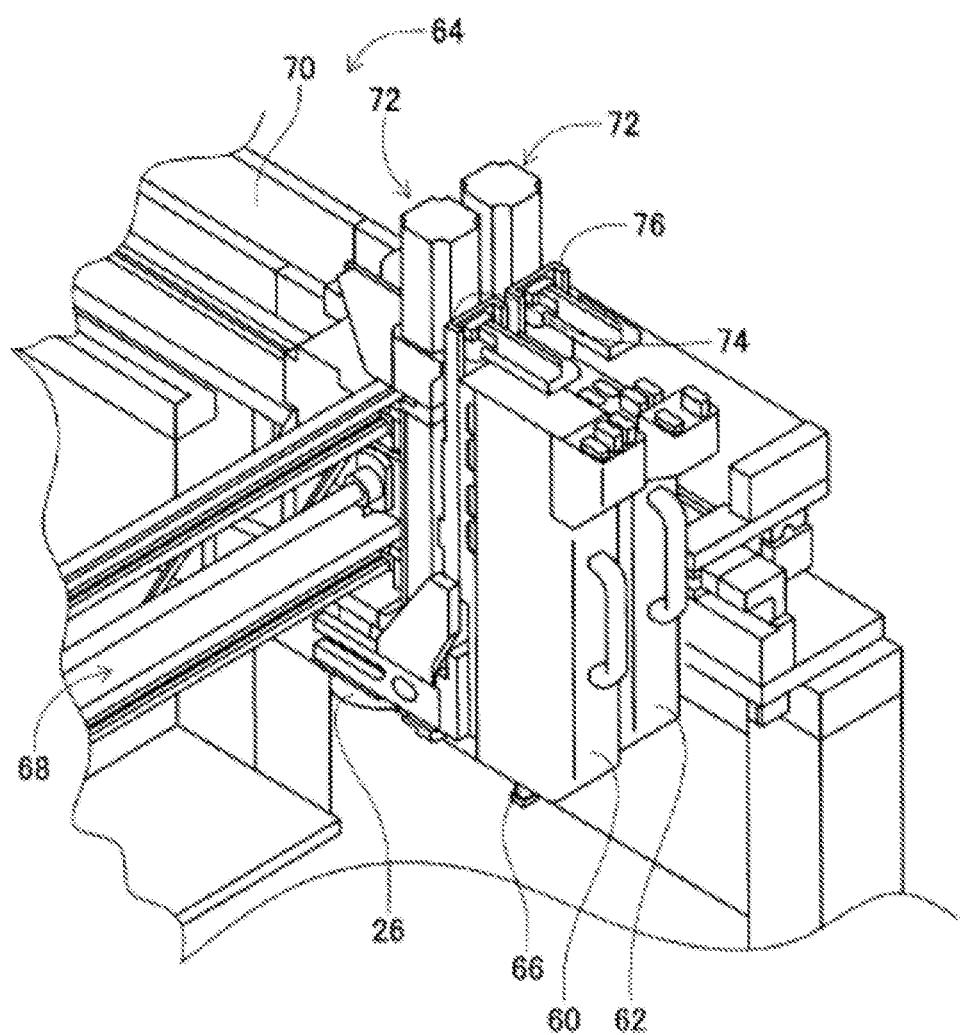
FIG. 2 A perspective view showing a component mounting device of the component mounting machine.

Component mounting device 24 is disposed in beam section 42 and has two work heads 60, 62 and work head moving device 64. Each work head 60, 62 has suction nozzle (refer to FIG. 2) 66 and holds the components with suction nozzle 66. Further, work head moving device 64 has X-direction moving device 68, Y-direction moving device 70, and Z-direction moving device 72. X-direction moving device 68, Y-direction moving device 70, and the two working heads 60, 62 are moved integrally to any position on frame section 40, As shown in FIG. 2, work heads 60, 62 are detachably installed on sliders 74, 76, and Z-direction moving device 72 moves sliders 74, 76 individually in the up-down direction. In other words, work heads 60, 62 are individually moved in the up-down direction by Z-direction moving device 72.

Imaging device 26 is attached to slider 74 while facing downward and is moved together with work head 60 in the X-direction, Y-direction, and Z-direction. Thus, imaging device 26 captures any position of frame section 40, Imaging device 28, as shown in FIG. 1, is disposed, while facing upward, between substrate conveyance and holding device 22 and component feeding device 30 on frame section 40. With this configuration, imaging device 28 captures a component held by suction nozzle 66 of work heads 60, 62.

Component feeding device 30 is disposed at one end, in the front-rear direction, of frame section 40, Component feeding device 30 has tray-type component feeding device 78 and feeder-type component feeding device (not shown), Tray-type component feeding device 78 is a device for supplying components placed on a tray. Feeder-type component feeding device is a device for supplying components with a tape feeder (not shown) or a stick feeder (not shown).

Bulk component supply device 32 is disposed at the other end in the front-rear direction of frame section 40, Bulk component supply device 32 is a device for aligning multiple scattered components and supplying the components in an aligned manner. That is, bulk component supply device 32 is a device for aligning multiple components in any orientation in a predetermined orientation and supplying the components in a predetermined orientation. Hereinafter, the configuration of bulk component supply device 32 will be described in detail. Components supplied by component feeding device 30 and bulk component supply device 32 may be electronic circuit components, components of a solar cell, components of a power module, and the like. Further, the electronic circuit component is a component having a lead, a component having no lead, or the like.

Figure 3:
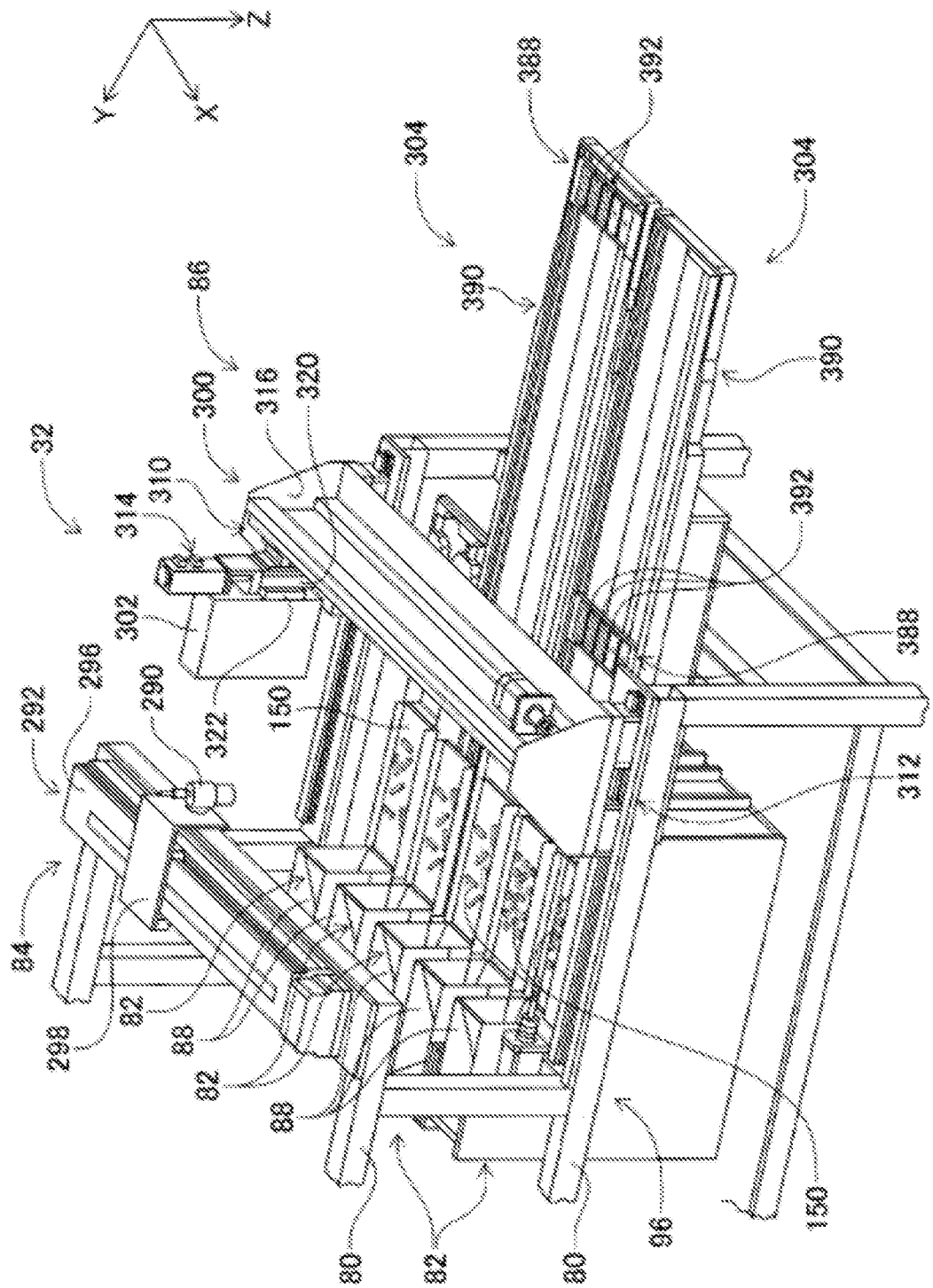
FIG. 3 A perspective view showing a bulk component supply device,
FIG. 4 A perspective view showing a component supply unit,
FIG. 5 A see-through view showing the component supply unit.

Bulk component supply device 32, as shown in FIG. 3, has main body 80, component supply unit 82, imaging device 84, and component delivery device 86.

(a) Component Feeding Unit

Component supply unit 82 includes component supplier 88, component scattering device (refer to FIG. 4) 90, and component return device (refer to FIG. 4) 92, and component supplier 88, component scattering device 90, and component return device 92 are integrally configured. Component supply unit 82 is detachably assembled to base 96 of main body 80, and in bulk component supply device 32, five component supply units 82 are arranged side by side in one row in the X-direction.

Figure 4:
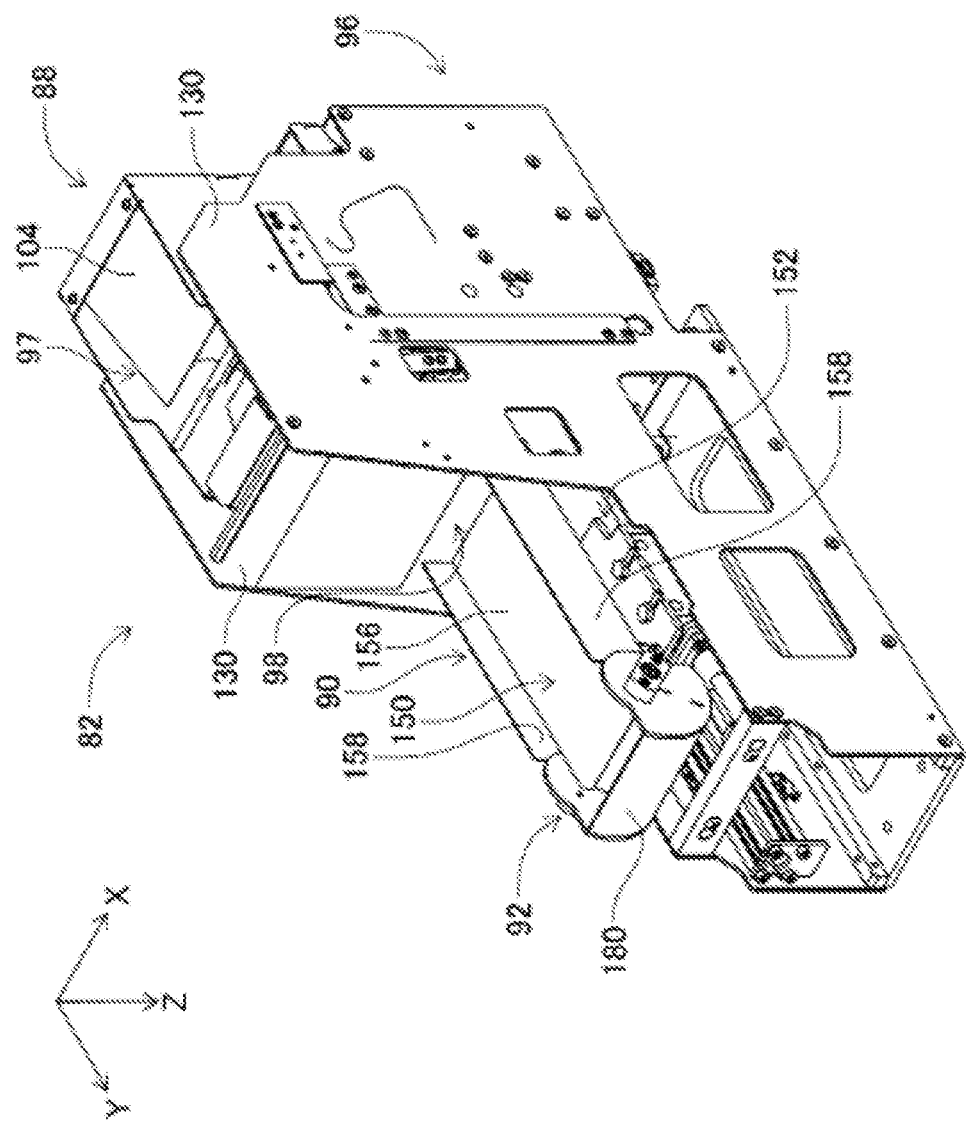
Figure 5:
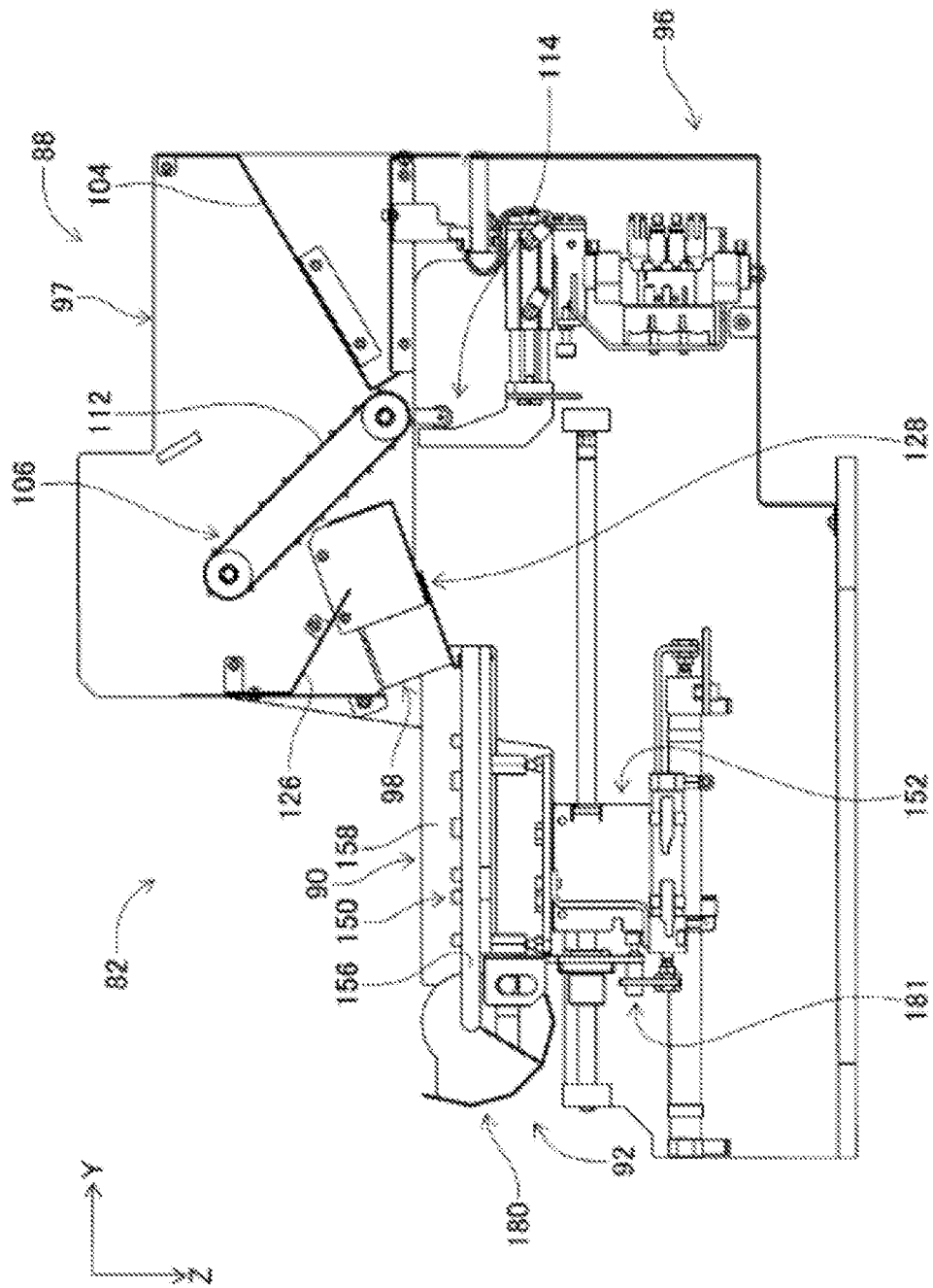

Component supplier 88 generally has a rectangular box shape, as shown in FIGS. 4 and 5, and is positioned so as to extend in the Y-direction. The Y-direction is described as the front-rear direction of component supplier 88, and in component supply unit 82, the direction toward the side in which component return device 92 is disposed is described as forward, and the direction toward the side in which component supplier 88 is disposed is described as rearward.

Component supplier 88 is open at the top and front faces, and the opening at the top face is inlet 97 for components and the opening at the front face is discharge port 98 for components. In component supplier 88, inclined plate 104 is disposed below inlet 97. Inclined plate 104 is directed toward the center from the edge of the rear side of component supplier 88 and is disposed so as to be inclined downward.

Further, in front of inclined plate 104, as shown in FIG. 5, conveyor device 106 is disposed, Conveyor device 106 is disposed so as to be inclined upward from the front end of inclined plate 104 to the front of component supplier 88. Conveyor belt 112 of conveyor device 106 rotates counterclockwise in FIG. 5. That is, the conveying direction of conveyor device 106 is obliquely upward from the front end of inclined plate 104 to the front.

Further, inclined plate 126 is disposed below the front end of conveyor device 106. Inclined plate 126 is disposed from the front end face of component supplier 88 toward the lower portion of conveyor device 106, with the rear end being inclined obliquely downward. Further, inclined plate 128 is disposed below inclined plate 126. Inclined plate 128 is inclined from below the central portion of conveyor device 106 toward discharge port 98 of component supplier 88, with the front end inclined downward.

Further, as shown in FIG. 4, a pair of side frame portions 130 are attached to base 96. The pair of side frame portions 130 are erected so as to extend parallel to each other in the Y-direction while facing each other. The distance between the pair of side frame portions 130 is slightly larger than the width of component feeder 88, and component feeder 88 is detachably installed between the pair of side frame portions 130.

Component scattering device 90 includes component support member 150 and component support member moving device 152, Component support member 150 is constituted by stage 156 and a pair of side wall portions 158. Stage 156 generally has an elongated plate shape and is positioned so as to extend forward from underneath component supplier 88 installed between the pair of side frame portions 130, The upper face of stage 156 is generally horizontal, as shown in FIG. 5, and is disposed with a slight clearance with respect to the front end of inclined plate 128 of component supplier 88. Further, the pair of side wall portions 158, as shown in FIG. 4, are erected on both sides in the longitudinal direction of stage 156 and fixed, and the upper end of each side wall portion 158 extends above the upper face of stage 156.

Further, component support member moving device 152 slides component support member 150 in the Y-direction by the operation of air cylinder (refer to FIG. 11) 166. As this occurs, component support member 150 moves between a retracted state (refer to FIG. 6) in which component support member 150 is retracted underneath component supplier 88 and an exposed state (refer to FIG. 5) in which component support member 150 is exposed from underneath component supplier 88.

Figure 7:
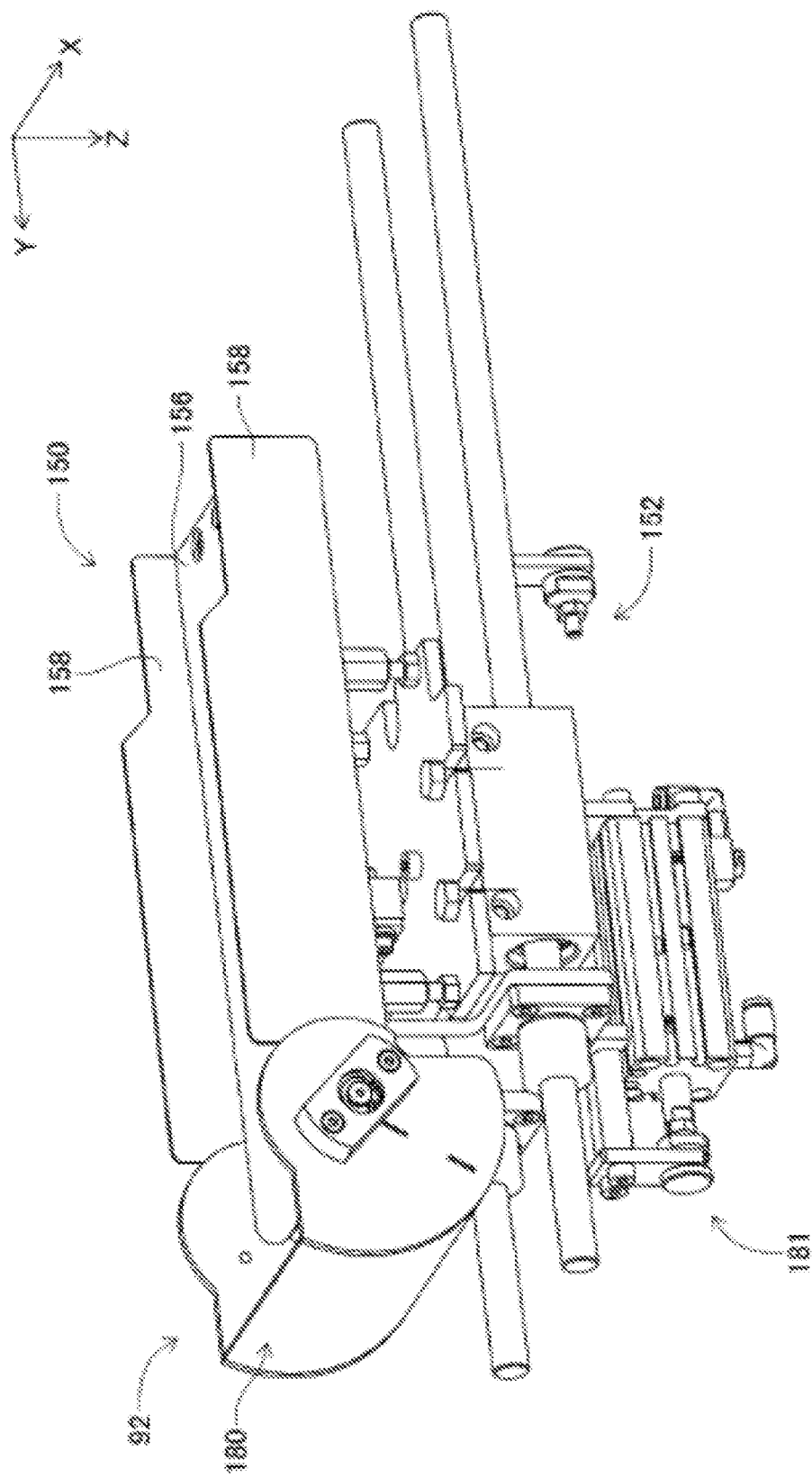
FIG. 7 A perspective view showing a component scattering device.
Figure 8:
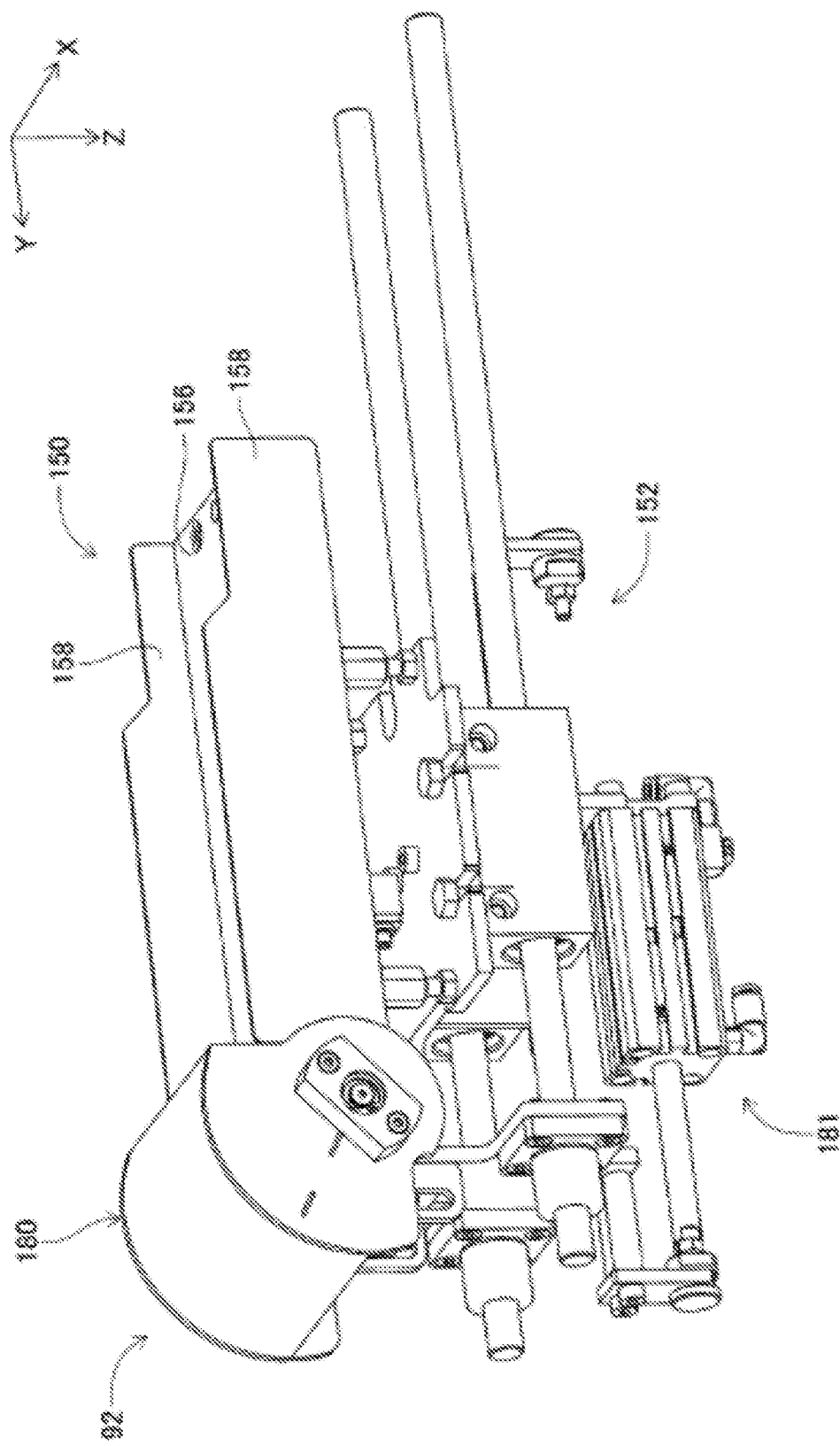
FIG. 8 A perspective view showing the component scattering device.

As shown in FIG. 7, component return device 92 includes component accommodating container 180 and container swing device 181. Component accommodating container 180 generally has a box-like shape with an arc-shaped bottom surface. Component accommodating container 180 is swingably held at the front end of stage 156 of component supporting member 150, and swings due to the operation of container swing device 181. Here, component accommodating container 180 swings between an accommodating orientation with the opening directed upward (refer to FIG. 7) and a returning orientation with the opening directed toward the upper face of stage 156 of component support member 150 (refer to FIG. 8).

(b) Imaging Equipment

Imaging device 84 includes camera 290 and camera moving device 292 as shown in FIG. 3. Camera moving device 292 includes guide rail 296 and slider 298. Guide rail 296 is secured to main body 80, above component supplier 88, so as to extend in the width direction (X-direction) of bulk component supply device 32. Slider 298 is slidably attached to guide rail 296 and slides to any position by actuation of electromagnetic motor (refer to FIG. 11) 299. In addition, camera 290, facing downward, is attached to slider 298.

(c) Component Delivery Device

Component delivery device 86 includes component holding head moving device 300, component holding head 302, and two shuttle devices 304, as shown in FIG. 3.

Component holding head moving device 300 includes X-direction moving device 310, Y-direction moving device 312, and Z-direction moving device 314. Y-direction moving device 312 has Y-slider 316 extending in the X-direction above component supply unit 82, and Y-slider 316 moves to any position along the Y-direction by the driving of electromagnetic motor (refer to FIG. 11) 319. X-direction moving device 310 has X-slider 320 disposed on a side face of Y-slider 316, and X-slider 320 moves to any position along the X-direction by the driving of electromagnetic motor (refer to FIG. 11) 321. Z-direction moving device 314 has Z-slider 322 disposed on a side surface of X-slider 320, and Z-slider 322 moves to any position along the Z-direction by the driving of electromagnetic motor (refer to FIG. 11) 323.

Figure 9:
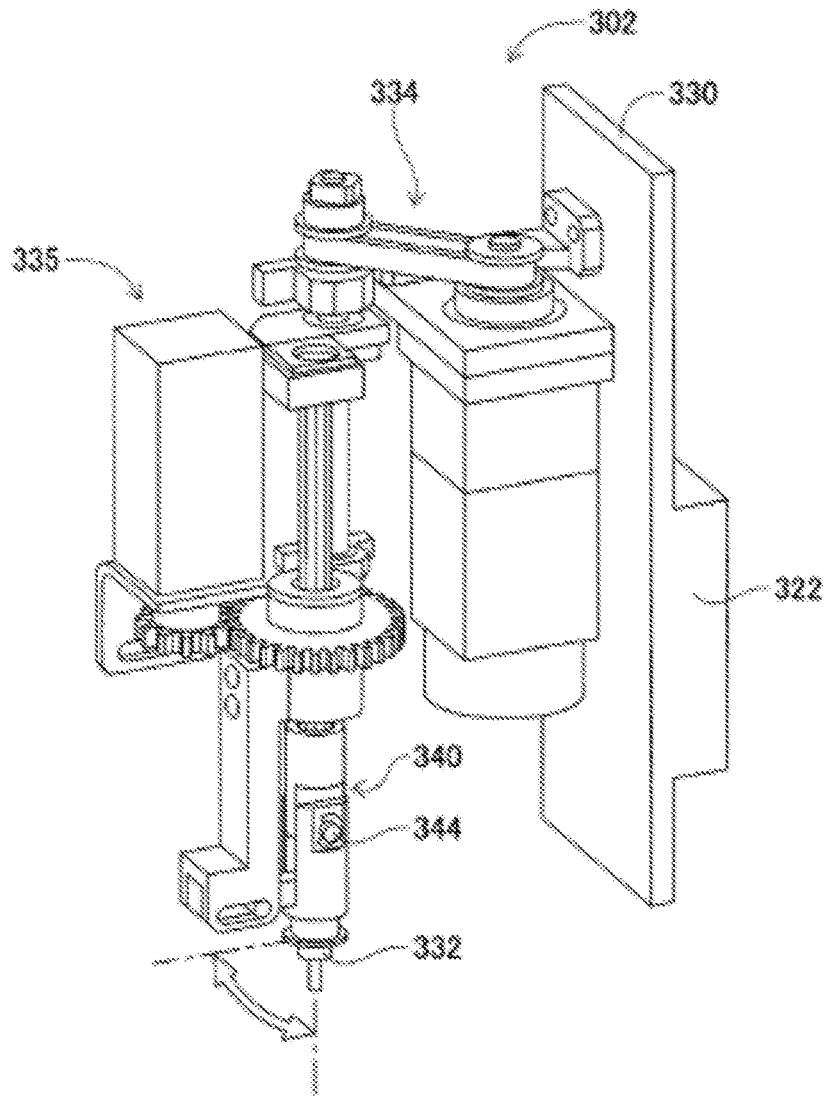
FIG. 9 A perspective view showing a component holding head.

Component holding head 302 includes head body 330, suction nozzle 332, nozzle turning device 334, and nozzle rotation device 335, as shown in FIG. 9. Head body 330 is formed integrally with Z-slider 322. Suction nozzle 332 holds components and is detachably attached to the lower end of holder 340. Holder 340 is bendable at support shaft 344, and the operation of nozzle turning device 334 causes holder 340 to bend 90 degrees upward. With this configuration, suction nozzle 332 attached to the lower end of holder 340 rotates 90 degrees and is positioned in a turned position. That is, suction nozzle 332 pivots between a non-turned position and a turned position by the operation of nozzle turning device 334. Of course, it is also possible to stop and position suction nozzle 332 at an angle between the non-turned position and the turned position. Nozzle rotating device 335 also rotates suction nozzle 332 about its axis.

Each of two shuttle devices 304 also includes component carrier 388 and component carrier moving device 390, as shown in FIG. 3, arranged laterally at the front of component feeding unit 82 and secured to main body 80. Five component receiving members 392 are laterally lined up in a single row and attached to component carrier 388. The five component receiving members 392 are intended to constitute five component supply units 82, one component receiving member 392 being included in one component supply unit 82. Therefore, for each component supply unit 82, there is one stage 156 and one component receiving member 392, and the stage 156 and the component receiving member 392 correspond to each other. A component on stage 156 is placed on component receiving member 392 corresponding to stage 156.

Figure 10:
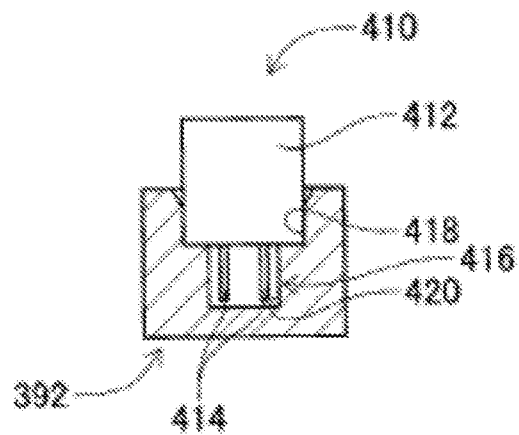
FIG. 10 A view showing a component receiving member in a state in which an electronic circuit component is stored,
FIG. 11 A block diagram showing a control device of the component mounting machine.

Bulk component supply device 32 is capable of supplying various components, and various types of component receiving member 392 are prepared depending on the shape of the components. Component receiving member 392 corresponding to lead component 410 having a lead, as shown in FIG. 10, will now be described, lead component 410 being an electronic circuit component supplied by bulk component supply device 32. Lead component 410 consists of a block-shaped component body 412 and two leads 414 protruding from the bottom face of component body 412.

Component receiving member 392 has component receiving recessed section 416 having a shape corresponding to lead component 410. Component receiving recessed section 416 is a stepped-shaped recess and is composed of main body receiving recessed section 418 that opens to the upper face of component receiving member 392 and lead receiving recessed section 420 that opens to the bottom face of main body receiving recessed section 418. Lead component 410 is inserted into component receiving recessed section 416 with leads 414 facing downward. As a result, lead component 410 is placed inside component receiving recessed section 416 in a state in which leads 414 are inserted into lead receiving recessed section 420 and component body 412 is inserted into body receiving recessed section 418.

Further, component carrier moving device 390, as shown in FIG. 3, is a plate-shaped elongated member disposed at the front of component supply unit 82 so as to extend in the front-rear direction. On the upper face of component carrier moving device 390, component carrier 388 is slidably disposed in the front-rear direction, and slides to any position in the front-rear direction by the driving of electromagnetic motor (refer to FIG. 11) 430. Incidentally, when component carrier 388 slides in a direction approaching component feeding unit 82, component carrier 388 slides up to the component receiving position located within the range in which component holding head 302 is movable by component holding head moving device 300. On the other hand, when component carrier 388 slides in a direction away from component supply unit 82, component carrier 388 slides up to the component supply position located within the range in which work heads 60, 62 is movable by work head moving device 64.

Figure 11:
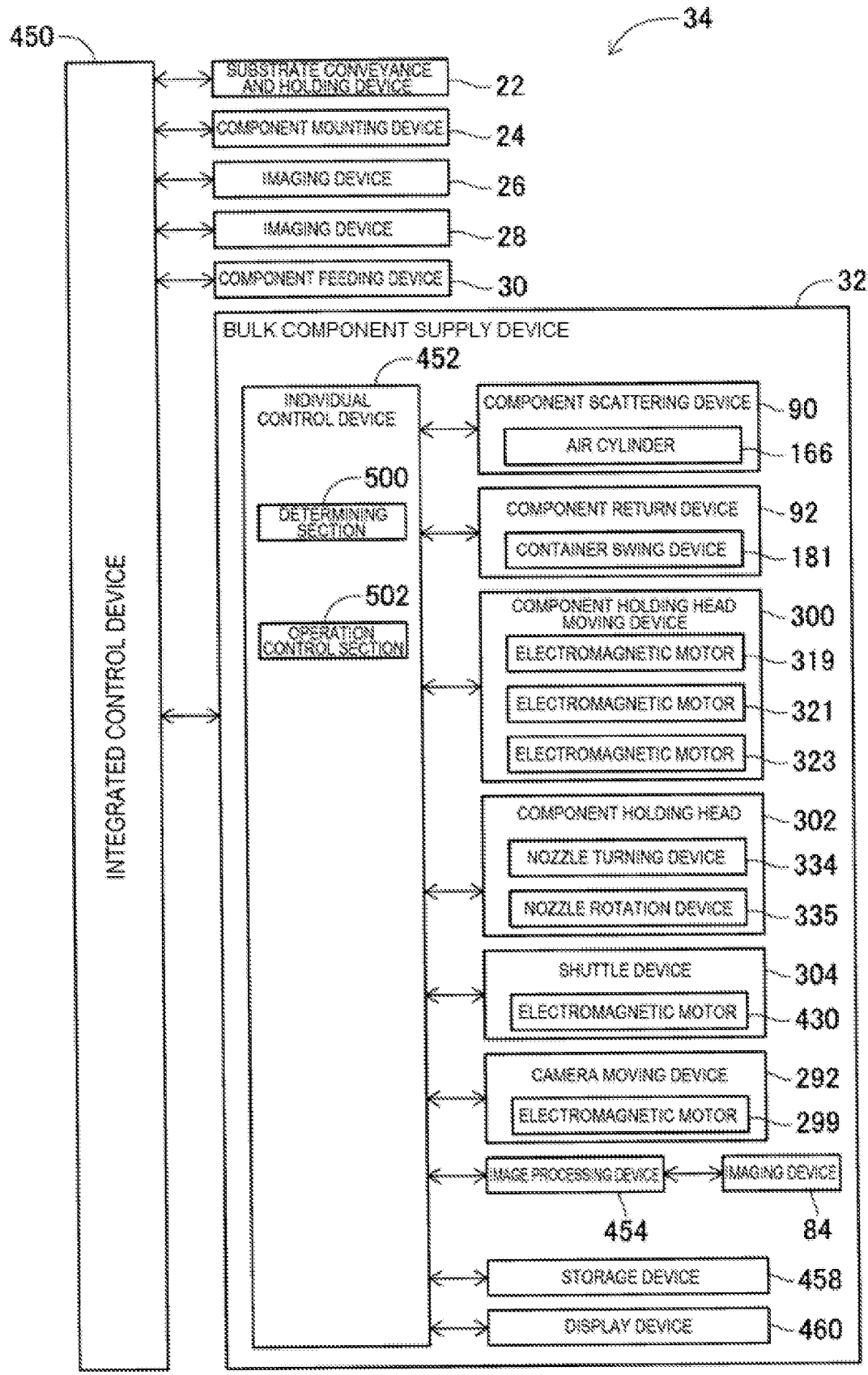

Further, control device 34 includes, as shown in FIG. 11, integrated control device 450, multiple individual control devices (only one is shown in FIG. 11) 452, and image processing device 454. Integrated control device 450 is made up mainly of a computer, and is connected to substrate conveyance and holding device 22, component mounting device 24, imaging device 26, imaging device 28, component feeding device 30, and bulk component supply device 32. Thus, integrated control device 450 collectively controls substrate conveyance and holding device 22, component mounting device 24, imaging device 26, imaging device 28, component feeding device 30, and bulk component supply device 32. Multiple individual control devices 452 are each made up mainly of a computer and are provided separately for substrate conveyance and holding device 22, component mounting device 24, imaging device 26, imaging device 28, component feeding device 30, and bulk component supply device 32 (in the figure, only individual control device 452 for bulk component supply device 32 is shown).

Individual control device 452 for bulk component supply device 32 is connected to component scattering device 90, component return device 92, camera moving device 292, component holding head moving device 300, component holding head 302, and shuttle devices 304. With this configuration, individual control device 452 of bulk component supply device 32 controls component scattering device 90, component return device 92, camera moving device 292, component holding head moving device 300, component holding head 302, and shuttle devices 304. Further, image processing device 454 is connected to imaging device 84 and processes imaging data captured by imaging device 84. Image processing device 454 is connected to individual control device 452 of bulk component supply device 32. Thus, individual control device 452 of bulk component supply device 32 acquires imaging data captured by imaging device 84. Bulk component supply device 32 has storage device 458. Storage device 458 is connected to individual control device 452 and stores various information in accordance with commands from individual control device 452. Further, bulk component supply device 32 also has display device 460, and display device 460 is connected to individual control device 452. As a result, any image is displayed on display device 460.

(B) Operation of Component Mounting Machine

Component mounting machine 10, with the configuration described above, mounts components on circuit substrate 12 held by substrate conveyance and holding device 22. Specifically, circuit substrate 12 is conveyed to a work position to which circuit substrate 12 is securely held by clamping device 52. Next, imaging device 26 moves above circuit substrate 12 and imaging circuit substrate 12. Thus, information about the error of the holding position of circuit substrate 12 is obtained. Component feeding device 30 or bulk component supply device 32 supplies the component at a predetermined supply position. The supplying of components by bulk component supply device 32 will be described in detail later. Then, either of work heads 60, 62 is moved above the supply position of the component and holds the component with suction nozzle 66. Work heads 60, 62 holding components move above imaging device 28, and components held by suction nozzles 66 are imaged with imaging device 28. This provides information about errors in the component holding position. Then, work heads 60, 62 holding components move above circuit substrate 12, correct errors in the holding position of circuit substrate 12, errors in the holding position of components, and the like, and then mount the held components on circuit substrate 12.

(C) Operation of Bulk Component Supply Device (a) Supplying of Lead Components by Bulk Component Supply Device In bulk component supply device 32, lead components 410 are loaded from inlet 97 of component supplier 88 by an operator, and the loaded lead components 410 are supplied by being placed on component receiving member 392 of component carrier 388 by the operation of component supply unit 82 and component delivery device 86.

Specifically, the operator supplies lead components 410 from inlet 97 at the upper face of component supplier 88. At this time, component support member 150 is moved into the retracted state underneath component supplier 88 by the operation of component support member moving device 152 (refer to FIG. 6). With component support member 150 in the retracted state, component storage container 180 disposed at the front end of component support member 150 is situated at the front of component supplier 88, assuming an orientation (an accommodating orientation) in which the opening of component accommodating container 180 is directed upwards.

Lead component 410 loaded from inlet 97 of component supplier 88 falls on inclined plate 104 of component supplier 88, and rolls down to the lower front end of inclined plate 104. At this time, lead components 410 which have rolled down to the lower front end of inclined plate 104 pile up between the lower front end of inclined plate 104 and the lower rear end of conveyor device 106. Then, when conveyor device 106 is actuated, conveyor belt 112 of conveyor device 106 rotates in the counterclockwise direction in FIG. 6. Thus, lead components 410 piled up between inclined plate 104 and conveyor belt 112 are conveyed diagonally upward by conveyor belt 112.

Lead components 410 conveyed by conveyor belt 112 fall on inclined plate 126 from the upper front end of conveyor device 106. Lead components 410 which have fallen on inclined plate 126 roll toward the rear of inclined plate 126 and then fall on inclined plate 128. Lead components 410 which have fallen on inclined plate 128 roll toward the front and are discharged from discharge port 98 at the front of component supplier 88.

As a result, lead components 410 discharged from discharge port 98 of component supplier 88 are accommodated in component accommodating container 180. Then, when a predetermined amount of lead components 410 are discharged from component supplier 88, that is, when conveyor device 106 has operated a certain extent, conveyor device 106 stops. Next, component support member 150 moves toward the front from the retracted state by the operation of component support member moving device 152.

Then, container swing device 181 of component return device 92 is activated to operate at a time at which component support member 150 has moved a predetermined amount from the retracted state toward the front, and component accommodating container 180 swings. As a result, the orientation of component accommodating container 180 changes vigorously from the orientation (accommodating orientation) in which the opening is directed upward to the orientation (return orientation) in which the opening is directed toward stage 156. When this occurs, lead components 410 accommodated in component accommodating container 180 are discharged vigorously toward stage 156. As a result, lead components 410 are scattered from component accommodating container 180 onto stage 156.

Figure 12:
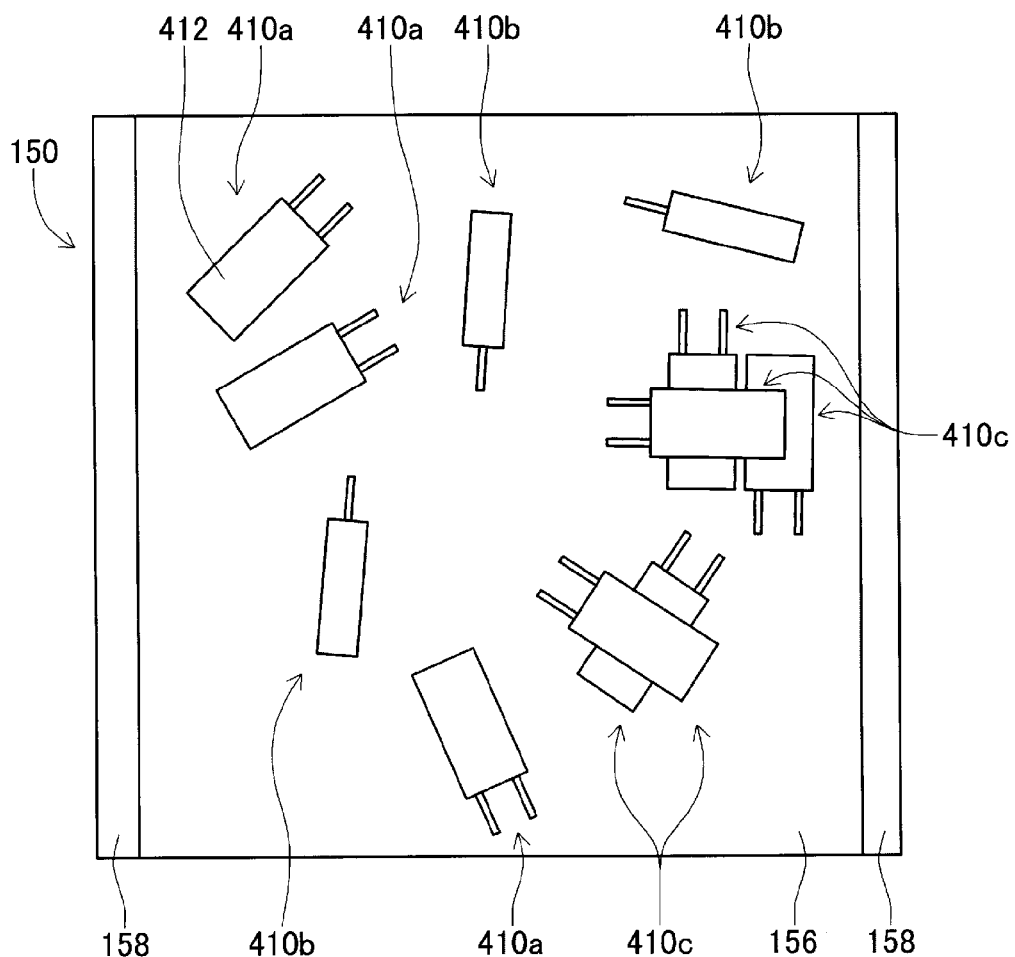
FIG. 12 A diagram showing a state in which lead components are scattered on a stage.

When lead components 410 are scattered over stage 156 of component support member 150, as shown in FIG. 12, lead components 410 are scattered over stage 156 in generally three orientations. Specifically, the first orientation is an orientation in which lead components 410 are scattered with the faces from which leads 414 project out of are directed laterally and the two leads 414 are generally aligned horizontally. Further, the second orientation is an orientation in which lead components 410 are scattered with the faces from which leads 414 project out are directed laterally and the two leads 414 are generally aligned vertically. Further, the third orientation is an orientation in which lead components 410 are scattered with two or more lead components 410 stacked one on top of another. When lead components 410 are distinguished according to scattering orientation, the orientations are described as lead components 410a for the first orientation, lead components 410b for the second orientation, and lead components 410c for the third orientation.

When lead components 410 are scattered over stage 156 as described above, camera 290 of imaging device 84 moves above component support member 150 by the operation of camera moving device 292. Lead components 410 scattered over stage 156 are then imaged by camera 290. Based on the imaging data captured by camera 290, lead components to be picked up (hereinafter, abbreviated as "pickup target components") are identified by pattern matching.

Figure 13:
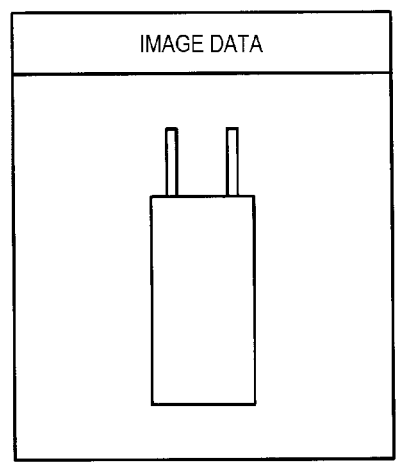
FIG. 13 A diagram showing a first component recognized by pattern matching.

Specifically, individual control device 452 identifies the outline of lead component 410 based on the imaging data of lead component 410 from camera 290 and calculates the shape of the top face of lead component 410, that is, the shape as viewed view from above lead component 410. Further, individual control device 452 also calculates the position of lead component 410 based on the imaging data. At the same time, as shown in FIG. 13, storage device 458 stores image data for the shape corresponding to the outline of lead component 410a in the first orientation (hereinafter, referred to as "first orientation component image data").

Individual control device 452 then determines whether the shape of the upper face of lead component 410 (hereinafter, referred to as "captured image component shape") calculated based on imaging data matches the shape of lead component 410 based on first orientation component image data (hereinafter, referred to as "first stored component shape"). Then, individual control device 452, when it is determined that the captured image component shape and the first stored component shape match, lead component 410 corresponding to the captured image component shape is certified as a pickup target component.

That is, lead component 410a in the first orientation is certified as a pickup target component, and lead component 410b in the second orientation and lead component 410c in the third orientation are not certified as pickup target components. This is because the upward facing surface area of lead component 410b in the second orientation is small and therefore cannot be properly held by suction nozzle 332. Further, in lead component 410c in the third orientation cannot be properly held by suction nozzle 332 because the upper surface of lead component 410c is not horizontal or the like.

Position information for lead components 410 which are certified as pickup target components are then calculated based on the imaging data. Next, based on the calculated position information of the pickup target component, component holding head 302 is moved above the pickup target component by the operation of component holding head moving device 300, and the pickup target component is picked up and held by suction nozzle 332, When pickup target component is being picked up and held by suction nozzle 332, suction nozzle 332 is in the non-turned position.

Then, after lead component 410 is held by suction nozzle 332, component holding head 302 moves to a position above component carrier 388. At this time, component carrier 388 is moved to component receiving position by the operation of component carrier moving device 390. Also, as component holding head 302 moves above component carrier 388, suction nozzle 332 is pivoted to the turned position. Suction nozzle 332 is turned by the operation of the nozzle rotating device 335 so that leads 414 of lead component 410 held by suction nozzle 332 are turned with orienting downwardly in vertical direction.

When component holding head 302 is moved to the position above component carrier 388, lead component 410 with leads 414 facing vertically downward is inserted into component receiving recessed section 416 of component receiving member 392. Thus, lead component 410, as shown in FIG. 10, with leads 414 directed downward in a vertical direction, is placed in component receiving member 392. Component receiving member 392 into which lead component 410 is placed corresponds to stage 156, which is the supply source for lead components 410. That is, components picked up from predetermined stage 156 are placed in component receiving member 392 corresponding to stage 156.

Then, when lead component 410 is placed in component receiving member 392, component carrier 388 moves to the component supply position by the operation of component carrier moving device 390. Since component carrier 388 moved to the component supply position is located in the moving range of work heads 60, 62, in bulk component supply device 32, lead component 410 is supplied to component mounting machine 10 at this position. Thus, in bulk component supply device 32, lead component 410 is supplied with leads 414 directed downward and the top face, which faces the bottom face to which leads 414 are connected, faces upward. As a result, suction nozzles 66 of work heads 60, 62 can properly hold lead components 410.

(b) Accommodating Electronic Components in Component Accommodating Containers and Scattering on Stages In bulk component supply device 32, when pickup target component is scattered over stage 156 of component support member 150, the picking up of pickup target components which are scattered is repeated, and the pickup target components which are picked up are placed in component receiving members 392. Then, mounted component carrier 388 of component receiving member 392 moving to the component supply position enables supplying of lead components 410.

However, lead components 410 cannot be picked up from stage 156 if pickup target components are not scattered over stage 156 of component support member 150. That is, if all of lead components 410 determined to be capable of being picked up have been picked up and lead components 410 determined to be incapable of being picked up remain on stage 156, then lead components 410 cannot be picked up from stage 156.

Therefore, in such a case in bulk component supply device 32, lead components 410 remaining on stage 156 are collected in component accommodating container 180. Lead components 410 collected in component container 180 are then scattered over stage 156 again, and the orientations of lead components 410 are changed, whereby picking up of lead components 410 from stage 156 is resumed.

Specifically, when all of the components to be picked up from stage 156 are picked up, component support member 150 moves underneath component supplier 88 by the operation of support member moving device 152. That is, component support member 150 moves to the retracted state (see FIG. 6) from the exposed state (see FIG. 5). As this occurs, component accommodating container 180 disposed at the front end of component supporting member 150 has an orientation in which the opening is directed upward. Then, when the component support member 150 moves toward the stored state from the exposed state, the lead component 410 on the stage 156 of the component support member 150 is barred by the front side end of the inclined plate 128 of the component supplier 88.

Figure 6:
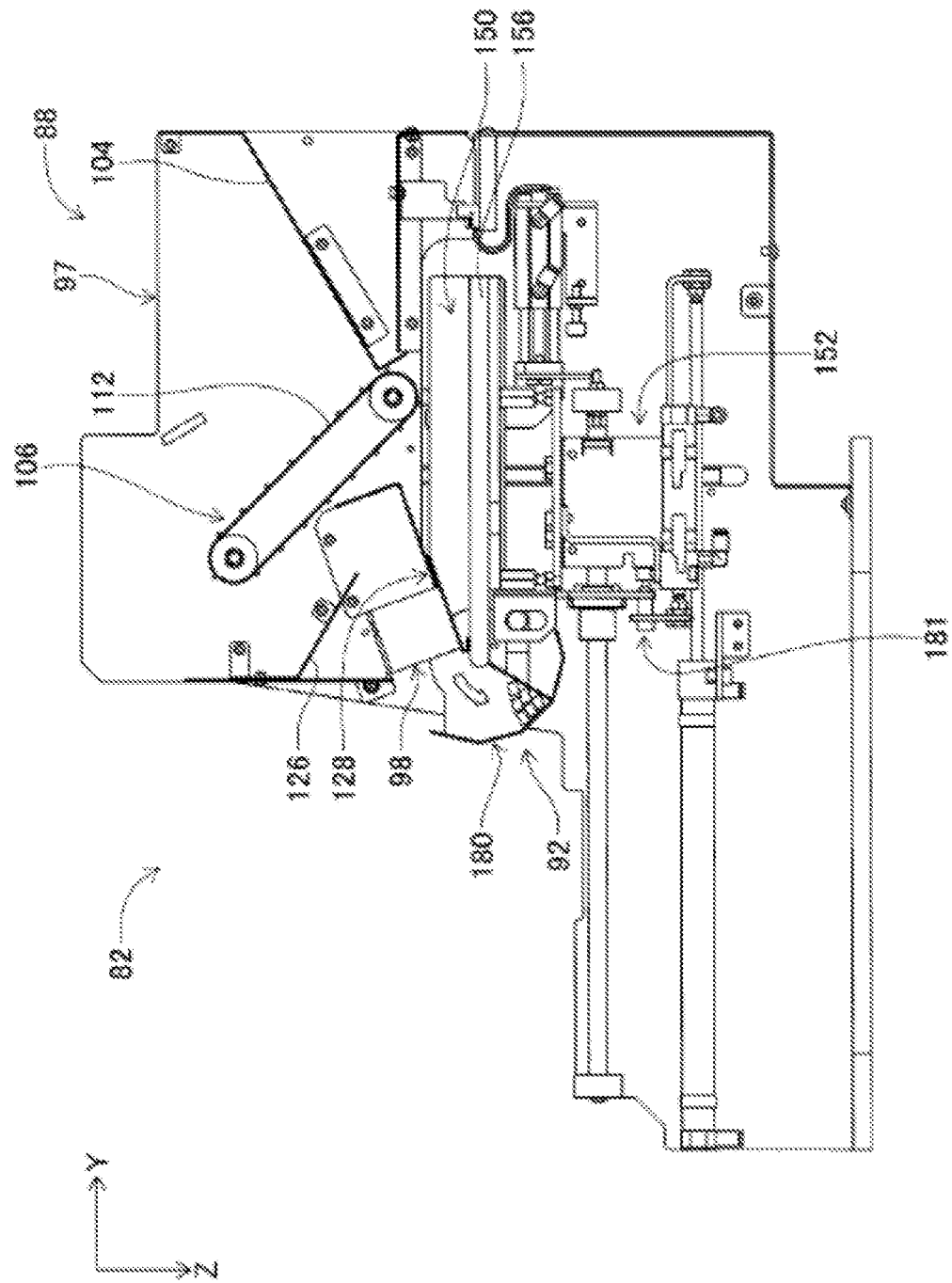
FIG. 6 A see-through view showing the component supply unit.

Further, as shown in FIG. 6, when component support member 150 moves to the retracted state, lead components 410 on stage 156 are scraped off into component accommodating container 180. As a result, lead components 410 on stage 156 are collected in component accommodating container 180. As described above, when lead components 410 on stage 156 are collected in component accommodating container 180, the collected lead components 410 are then replenished to stage 156.

More specifically, when the collection of lead components 410 in component accommodating container 180 is completed, component support member 150 is in the retracted state, as shown in FIG. 6. Therefore, component support member 150 moves toward the front from the retracted state by the operation of component support member moving device 152. Then, container swing device 181 of component return device 92 is activated to operate at a time at which component support member 150 has moved a predetermined amount from the retracted state toward the front, and component accommodating container 180 swings. As a result, the orientation of component accommodating container 180 changes vigorously from the orientation (accommodating orientation) in which the opening is directed upward to the orientation (return orientation) in which the opening is directed toward stage 156.

When this occurs, lead components 410 accommodated in component accommodating container 180 are discharged vigorously toward stage 156. That is, lead components 410 are scattered from component accommodating container 180 onto stage 156. This changes the orientations of the replenished lead components 410 and the lead components 410 are again picked up from stage 156. That is, lead components 410 in the second orientation and lead components 410 in the third orientation are accommodated in component accommodating container 180 from stage 156, and accommodated lead components 410 are scattered from component accommodating container 180 to stage 156. When this occurs, the orientations of lead components 410 are changed, and lead components 410 in the first orientation are recognized with pattern matching and picked up.

(c) Countermeasures Against Mixing of Different Components

Thus, in bulk component supply device 32, utilizing pattern matching, lead components 410 of the first orientation are picked up from stage 156. That is, the first stored component shape is stored in storage device 458, and lead components 410 in the first orientation on the stage are recognized, based on imaging data from camera 290 and the first stored component shape stored in storage device 458, and these lead components 410 are picked up. Further, lead components 410 in the second orientation and lead components 410 in the third orientation are accommodated in component accommodating container 180 and by scattering the components from component accommodating container 180 to the stage, the orientations are changed to the first orientation. Lead components 410 that have been changed to the first orientation are then picked up from stage 156 utilizing pattern matching.

In other words, by repeatedly accommodating lead components 410 from the stage in component accommodating container 180 and scattering the lead components 410 from component accommodating container 180 to the stage, the lead components 410 are recognized as lead components 410 in the first orientation and picked up from the stage. However, if stage 156 contains lead components of a different type than lead components 410, the different types of lead components may not be recognized by the above-described method and the work of picking up the components may not be performed properly.

Specifically, in bulk component supply device 32, five component supply units 82 are disposed, Those five component supply units 82 normally supply different types of components. Specifically, for example, first component supply unit 82 supplies the first type of lead component (hereinafter referred to as "first component") 410, second component supply unit 82 supplies the second type of lead component (hereinafter referred to as "second component") 470 (see FIG. 14), and third component supply unit 82 supplies the third type of lead component (hereinafter referred to as "third component") 480 (see FIG. 14), In bulk component supply device 32, five component supply units 82 are disposed, and in order to simplify the description, only the first to third component supply units 82 will be described.

Thus, in the first to third component supply units 82, when the three types of components are supplied, there may be a case of charging different components in each component supply unit 82 with mixing components to be supplied, in such a timing that the operator puts the components into component supplier 88 of each component supply unit 82. That is, for example, in first component supply unit 82, not only first components 410 but second components 470 and third components 480 may also be charged into component supplier 88 in a mixed state.

In such a case, when the components are discharged from component supplier 88 to stage 156, as shown in FIG. 14, not only first components 410 but second components 470 and third components 480 are also scattered on the stage. Then, when the components are picked up from the stage 156 by using pattern matching according to the above-described technique, only first component 410 of the first orientation is picked up. In addition, only first component 410 that has been changed to the first orientation is picked up, as a result of repeating the operation of accommodating the components in the component accommodating container 180 and scattering the components onto the stage from the component accommodating container 180.

That is, first component 410 is recognized by pattern matching and picked up through the repeated operations of the accommodation in the component accommodating container 180 and the scattering from the component accommodating container 180 onto the stage. On the other hand, as for second components 470 and third components 480, they are not recognized by pattern matching in spite of the repeated operations of accommodation in the component accommodating container 180 and scattering from the component accommodating container 180 onto the stage for many times, which turns out continuously remaining in stage 156 without being picked up. Therefore, the arrangement space dominated by second components 470 and third components 480, the space in which first components 410 are scattered is reduced, and the number of first components 410 of the first orientation decreases. Thus, when the number of first components 410 of the first orientation decreases, the supply timing of the components by first component supply unit 82 is delayed, and the cycle time is likely to be reduced.

Further, for example, at first component supply unit 82, the operator may possibly charge second components 470 or third components 480 into component supplier 88 by mistake, without charging first component 410. In such a case, at first component supply unit 82, even if the operation of the accommodation in component storage container 180 and scattering from component storage container 180 onto the stage is repeated many times, the components are neither recognized at all nor supplied. Then, when the component cannot be recognized after repeating a predetermined number of times, an error screen is displayed for prompting the operator to confirm the charged component. In other words, after accommodating in component storage container 180 and scattering from component storage container 180 onto the stage are repeated for a predetermined number of times, the operator notices the error occurring for the charged components. In such a case, however, due to the significant delay of supplying timing of components by first component supply unit 82, which ends up lowering the cycle time significantly.

In view of this, in bulk component supply device 32, in addition to the image data of the components scheduled to be supplied, the image data relating to the components that are not scheduled to be supplied is also stored in storage device 458 in each of components supply units 82. Specifically, for example, as the data relating to first component supply unit 82, the image data of the shape corresponding to the external line of first component 410 is stored in storage device 458; of which image data corresponding to the first orientation component image data (see FIG. 13), however, additional image data as shown in FIG. 15, that is, the image data of the shape corresponding to the external line of second component 470 (hereinafter, referred to as "the second component image data"), and the image data of the shape corresponding to the external line of third component 480 (hereinafter, referred to as "the third component image data") are also stored. Incidentally, the second component image data and the third component image data are the data of the shapes corresponding to the external line of second component 470 and third component 480, representing the first orientation. The first orientation component image data is stored as OK image data, while the second component image data and the third component image data are stored as NG image data.

Then, when the components are scattered onto the stage 156 of first component supply unit 82, first component 410 is recognized by pattern matching out of the components scattered in the stage 156. That is, after the images of the components scattered in the stage 156 are captured by camera 290, based on the imaging data obtained by the captured images and the first orientation component image data, being stored as OK image data in storage device 458, the presence or absence of first component 410 with the first orientation is determined. At this time, when it is determined that first component 410 with the first orientation is present, first component 410 is recognized as a pick-up target component. Then, the recognized first component 410 is held by suction nozzle 332, and first component 410, being held, is placed on component receiving member 392 of first component supply unit 82, so that first component 410 is supplied by first component supply unit 82.

Further, presence or absence of second component 470 or third component 480 is determined during a period while suction nozzle 332 holds first component 410, being recognized by the pattern matching, and the component is supplied in a state of being placed on component receiving member 392, which is obtained by utilizing a time for performing the supply work of first component 410. More specifically, determination of whether second component 470 is present or absent on stage 156 is made based on the captured image data used for determining the presence or absence of first component 410 and the second component image data stored as NG image data in storage device 458. More overly, determination of whether third component 480 is present or absent on stage 156 is made based on the captured image data used for determining the presence or absence of first component 410 and the third component image data stored as NG image data in storage device 458.

At this time, for example, when it is determined that second component 470 is present on the stage 156, the position and the like of second component 470 are calculated, and second component 470 is held by the suction nozzle 332 from the calculated position. Then, the second component 470 so held is placed on the component receiving member 392 according to the above-described procedure. As for the component receiving member 392 on which second component 470 is placed, it is component receiving member 392 of second component supply unit 82, rather than component receiving member 392 of first component supply unit 82. That is, when second component 470 is present on stage 156 of first component supply unit 82, second component 470 is placed on component receiving member 392 of second component supply unit 82 where second component 470 is scheduled to supply.

Further, for example, when it is determined that third component 480 is present on stage 156, third component 480 is held by suction nozzle 332 and placed on component receiving member 392. Incidentally, component receiving member 392 on which third component 480 is mounted is component receiving member 392 of third component supply unit 82, That is, when third component 480 is present on stage 156 of first component supply unit 82, third component 480 is placed on component receiving member 392 of third component supply unit 82 where third component 480 is scheduled to supply.

Further, when second components 470 or third components 480 are present on stage 156 of first component supply unit 82, and the component is placed on appropriate component receiving member 392, first notification screen (not shown) is displayed on display device 460. On the first notification screen, a comment is displayed with indicating such that second component 470 or third component 480 is present on stage 156 of first component supply unit 82, and the component is now placed on component receiving member 392. Also displayed on the first notification screen is an OK button, and the first notification screen is made not shown by operating the OK button.

In sum, at bulk component supply device 32, the first orientation component image data, as OK image data relating to first component supply unit 82, and the second and the third component image data, as NG image data, are stored in storage device 458. Then, second component 470 or third component 480, of which presence on stage 156 of first component supply unit 82 being recognized based on the second or the third component image data, can be picked up from stage 156. In other words, components that are not scheduled to be supplied at first component supply unit 82 are picked up from stage 156 of first component supply unit 82. Therefore, since the components that are not scheduled to be supplied at first component supply unit 82 can be removed from the stage, it is possible to increase the available space for arranging the components that are scheduled to be supplied by first component supply unit 82. As a result, the number of first components 410 in the first orientation on the stage increases, and thus first components 410 can be appropriately supplied.

Further, second component 470 or third component 480, both being picked up from the stage 156 of first component supply unit 82, are placed on the respective component receiving members 392 of second component supply unit 82 or third component supply unit 82 depending on their supply schedules. As a result, second component 470 or third component 480 mixed in first component supply unit 82 can be supplied in respective component receiving member 392 of the respective component supply units 82 to which those components are scheduled to supply.

Further, analysis of image data by pattern matching requires a relatively large number of analyses. Therefore, when the analysis based on the OK image data and the analysis based on the NG image data are executed simultaneously, the time required for these analysis becomes long, and there is a possibility that the cycle time is lowered. For this reason, analysis based on the OK image data is executed firstly, and by using the time during the period while the supply operation of the components is executed based on the first analytic result, analysis based on the NG image data is executed. This makes it possible to suppress a decrease in cycle time caused by the analysis time.

Further, in the case where the components not scheduled to supply at the component supply unit 82 is recognized on stage 156 of the component supply unit 82, the first notification screen is displayed on display device 460. As a result, the operator is notified of the different components being mixed in component supply unit 82, which enables to alert the operator of the mixing of the foreign matter.

Incidentally, when a number of different components, such as second component 470 and third component 480, are mixed at first component supply unit 82 with first component 410 as shown in FIG. 14, many of first component 410 are placed on component receiving member 392 of first component supply unit 82. Further, a number of second component 470 and third component 480, being mixed with first component 410, are each placed on component receiving member 392 of respective component supply units 82 where the components are respectively scheduled to supply. However, for example, there is a case of charging second component 470 instead of first component 410 into the component supplier 88 of first component supply unit 82, which is caused by mistake of the operator. In such a case, although second component 470 can be placed and supplied to component receiving member 392 of component supply unit 82, to which the component is scheduled to supply, without supplying first component 410, the mounting operation of first component 410 cannot be performed.

Therefore, at first component supply unit 82, when the components different from a component to be supplied, that is, second component 470 or third component 480 are repeatedly recognized for predetermined times, the second notification screen is displayed on display device 460. The second notification screen displays a comment prompting confirmation of components of first component supply unit 82. Then, the operator is prompted to check the component of first component supply unit 82, in case of the result of the confirmation founding out the components being charged by mistake, the incorrectly charged components are replaced with the components scheduled to supply. Thus, this makes it possible for the operator to notice the errors of the charged components at early stage, and by replacing the components with those scheduled to supply, the appropriate components, namely first component 410, can be supplied.

The above mentioned descriptions have been made by featuring first component supply unit 82, however, the same process as described above can be also applied to second component supply unit 82 as well as to third component supply unit 82, so that the same process is executable in any which component supply units. It is noted that, however, the second component image data, as OK image data relating to second component supply unit 82, and the first orientation component image data and the third component image data, as NG image data, are stored in storage device 458. Further, the third component image data, as OK image data relating to third component supply unit 82, and the first orientation component image data and the second component image data, as NG image data, are stored in storage device 458.

Individual control device 452, as shown in FIG. 11, has determining section 500 and operation control section 502. Determining section 500 is a functional unit for executing pattern matching based on OK image data and also pattern matching based on NG image data. Further, the operation control section 502 is a functional section to control the operations in accordance with the determination results based on the pattern matching, such as causing suction nozzle 332 to hold the components on the stage, and causing component holding head moving device 300 and component holding head 302 to place the components so held to the components receiving member 392.

Incidentally, bulk component supply device 32 is an example of a component supply device. Stage 156 is an example of a stage. Camera 290 is an example of an imaging device. Component holding head moving device 300 is an example of a moving device. Component holding head 302 is an example of a component holding head, Component receiving member 392 is an example of a placement section. Storage device 458 is an example of a storage device. Display device 460 is an example of a notifying device. Determining section 500 is an example of a determination device. Operation control section 502 is an example of a control device.

It should be noted that the present disclosure is not limited to the above-mentioned embodiments, and can be implemented in various modes in which various modifications and improvements are made based on the knowledge of a person skilled in the art. Specifically, for example, in the above embodiment, the second component image data and the third component image data stored as NG image data are the image data of second component 470 and third component 480 in the first orientation but may be the image data of second component 470 and third component 480 in other orientations. That is, image data of second component 470 third component 480 in the second orientation or the third orientation may be stored in storage device 458 as NG image data. Further, although the image data of second component 470 and third component 480 are stored in storage device 458 as NG image data, the image data of components that are not scheduled to be supplied by any of the five component supply units 82 may be stored in storage device 458. In other words, the image data of the component which is not scheduled to be supplied by the five component supply units 82 may be stored in storage device 458 as NG image data. However, since a component with an orientation other than the first orientation or a component recognized based on image data of a component, which is not scheduled to be supplied by any of the five component supply units 82, cannot be mounted on component receiving member 392, mounting of the component on component receiving member 392 is not performed, but a screen indicating this result is displayed on the display device.

Further, in the above embodiment, pattern matching based on NG image data is executed at the time of supplying first component 410, but pattern matching based on NG image data may be executed at various times as long as pattern matching based on OK image data is not executed. For example, if pattern matching based on OK image data in the five component supply units 82 have been completed, then pattern matching based on the NG image data may be performed at a timing of imaging the stage for the purpose of performing pattern matching being not needed. Pattern matching based on NG image data may also be performed at a time when component holding head 302 is positioned below camera 290, which makes it impossible to image stage 156 by camera 290. Further, the stage to be imaged comes to be a storage state, and at a time at which it is not possible to image stage 156 of the stage to be imaged by the camera 290, the pattern matching based on NG image data may be executed.

In the above embodiment, the present disclosure is applied to a lead component, but the present disclosure can be applied to various types of components. Specifically, the present disclosure can be applied to, for example, solar cell components, power module components, electronic circuit components having no leads, and the like.

REFERENCE SIGNS LIST

32: Bulk component supply device (Component supply device), 156: Stage, 290: Camera (Imaging device), 300: Component holding head moving device (Moving device), 302: Component holding head, 392: Component receiving member (Placement section), 458: Storage device, 460:

Display device (Notifying device), 500: Determining section (Determination device), 502: Operation control section (Control device)

The invention claimed is:

1. A component supply device, comprising:
   multiple stages on which components are scattered;
   an imaging device including a camera configured to image the components scattered on the multiple stages; and
   a control device comprising a storage device and a determination device;
   wherein the storage device stores first identification information capable of identifying a first component which is a component scheduled to be supplied from a first stage of the multiple stages and second identification information capable of identifying a second component which is a component different from the first component that is not scheduled to be supplied from the first stage; and
   wherein the determination device determines whether the first component is present on the first stage based on the first identification information and imaging data of the first stage from the imaging device, and determines whether the second component is present on the first stage based on the second identification information and the imaging data of the first stage from the imaging device.

2. The component supply device of claim 1, wherein the second component is a component that is scheduled to be supplied from a second stage of the multiple stages, the second stage being different from the first stage.

3. The component supply device of claim 2, the component supply device further comprising:
   a component holding head;
   a component holding head moving device configured to move the component holding head; and
   a placement section provided for each of the multiple stages where components from the corresponding stages are placed;
   wherein the control device controls operation of the component holding head and the component holding head moving device so that the first component is placed into the placement section corresponding to the first stage when the determination device determines that the first component is on the first stage, and controls operation of the component holding head and the moving device so that the second component is placed into the placement section corresponding to the second stage when the determination device determines that the second component is on the first stage.

4. The component supply device of claim 1, wherein the component supply device further comprises a notifying device configured to send out an error notification when it is determined by the determination device that there are a set number or more of the second component on the first stage.

5. The component supply device of claim 1, wherein when the determination device determines that the first component is present on the first stage the determination device then determines whether the second component is present on the first stage using a time during which the determined first component is being supplied by the component supply device.

6. The component supply device of claim 1, wherein the determination device determines whether the first component is present on the first stage based on the first identification information and the imaging data of the first stage from the imaging device, and then determines whether the second component is present on the first stage based on the imaging data of the first stage used to determine if the first component is present on the first stage and the second identification information.

* * * * *